(12) United States Patent
Wang et al.

(10) Patent No.: US 8,293,647 B2
(45) Date of Patent: Oct. 23, 2012

(54) BOTTOM UP PLATING BY ORGANIC SURFACE PASSIVATION AND DIFFERENTIAL PLATING RETARDATION

(75) Inventors: Jenn-Yue Wang, Fremont, CA (US); Hua Chung, San Jose, CA (US); Rong Tao, San Jose, CA (US); Hong Zhang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 462 days.

(21) Appl. No.: 12/620,818

(22) Filed: Nov. 18, 2009

(65) Prior Publication Data
US 2010/0130007 A1 May 27, 2010

Related U.S. Application Data

(60) Provisional application No. 61/117,540, filed on Nov. 24, 2008.

(51) Int. Cl.
*H01L 21/44* (2006.01)
(52) U.S. Cl. ........ 438/677; 438/618; 438/620; 438/637; 438/641; 438/674; 438/675
(58) Field of Classification Search .................. 438/618, 438/620, 637, 641, 674, 675, 677
See application file for complete search history.

(56) References Cited

U.S. PATENT DOCUMENTS

| | | | |
|---|---|---|---|
| 3,959,874 A * | 6/1976 | Coucoulas | 29/856 |
| 6,410,418 B1 * | 6/2002 | Yang | 438/626 |
| 7,051,934 B2 * | 5/2006 | Lee et al. | 235/462.01 |
| 2001/0008226 A1 | 7/2001 | Hung et al. | |
| 2001/0055851 A1 * | 12/2001 | Horii | 438/393 |
| 2003/0186524 A1 * | 10/2003 | Ryo | 438/597 |
| 2004/0079728 A1 | 4/2004 | Mungekar et al. | |
| 2004/0248375 A1 | 12/2004 | Mcneil et al. | |
| 2005/0085070 A1 * | 4/2005 | Park | 438/643 |
| 2006/0076312 A1 | 4/2006 | Mcreynolds et al. | |
| 2006/0105534 A1 * | 5/2006 | Edelstein et al. | 438/329 |
| 2006/0144618 A1 | 7/2006 | Song et al. | |
| 2008/0026555 A1 | 1/2008 | Dubin et al. | |
| 2008/0102401 A1 * | 5/2008 | Chen et al. | 430/270.1 |
| 2008/0246068 A1 | 10/2008 | Cheng et al. | |
| 2009/0294920 A1 * | 12/2009 | Chudzik et al. | 257/632 |

FOREIGN PATENT DOCUMENTS

| | | |
|---|---|---|
| KR | 2001-0004718 | 1/2001 |
| KR | 2005-0011105 | 1/2005 |
| KR | 2005-0056383 | 6/2005 |
| KR | 2006-0078112 | 7/2006 |

OTHER PUBLICATIONS

PCT International Search Report and Written Opinion dated Jun. 21, 2010 for International Application No. PCT/US2009/06519.

* cited by examiner

*Primary Examiner* — Bac Au
(74) *Attorney, Agent, or Firm* — Patterson & Sheridan, LLP (57) ABSTRACT

Embodiments of the present invention generally relates to an apparatus and a method for processing semiconductor substrates. One embodiment provides a method provides a method for processing a substrate comprising forming a seed layer over a substrate having trench or via structures formed therein, coating a portion of the seed layer with an organic passivation film, and immersing the trench or via structures in a plating solution to deposit a conductive material over the seed layer not covered by the organic passivation film.

17 Claims, 12 Drawing Sheets

BOTTOM UP PLATING BY ORGANIC SURFACE PASSIVATION AND DIFFERENTIAL PLATING RETARDATION

CROSS-REFERENCE TO RELATED APPLICATIONS

This application claims benefit of U.S. provisional patent application Ser. No. 61/117,540, filed Nov. 24, 2008, which is herein incorporated by reference.

BACKGROUND OF THE INVENTION

1. Field of the Invention

Embodiments of the present invention generally relate to an apparatus and a method for processing semiconductor substrates. Particularly, embodiments of the present invention relates to methods and apparatus for performing a bottom up plating.

2. Description of the Related Art

With continuous decrease of semiconductor device dimensions, trench or via structures formed on a semiconductor substrate during fabrication become increasingly narrow and high in aspect ratio. Narrow opening and high aspect ratio usually present difficulties and challenges for subsequent material filling process. As a result, voids are more likely to form in the filling material because the narrow openings would be pinched off during filling process.

The problem becomes more pronounced when a liner, barrier, or seed layer is requested for the filling process, such as in a plating process where a seed layer is required. The seed layer is usually deposited on the trench or via structure using a physical vapor deposition (PVD) process. To achieve a complete coverage over the trench or via surfaces, the seed layer is usually thicker near an entrance of the trench or via and near a bottom of the trench or via. The thick portion of the seed layer has smaller electrical resistance, therefore attracting more plating current and resulting in quick plating. As a result, plating is faster near the opening of the trench or via and material plated near the opening pinches off the opening before the trench or via is filled, forming voids in the trench or via. The voids are not desirable because they reduce conductivity of the interconnect formed in the trench or via and also reduce physical strength of the interconnect.

Figure 1:
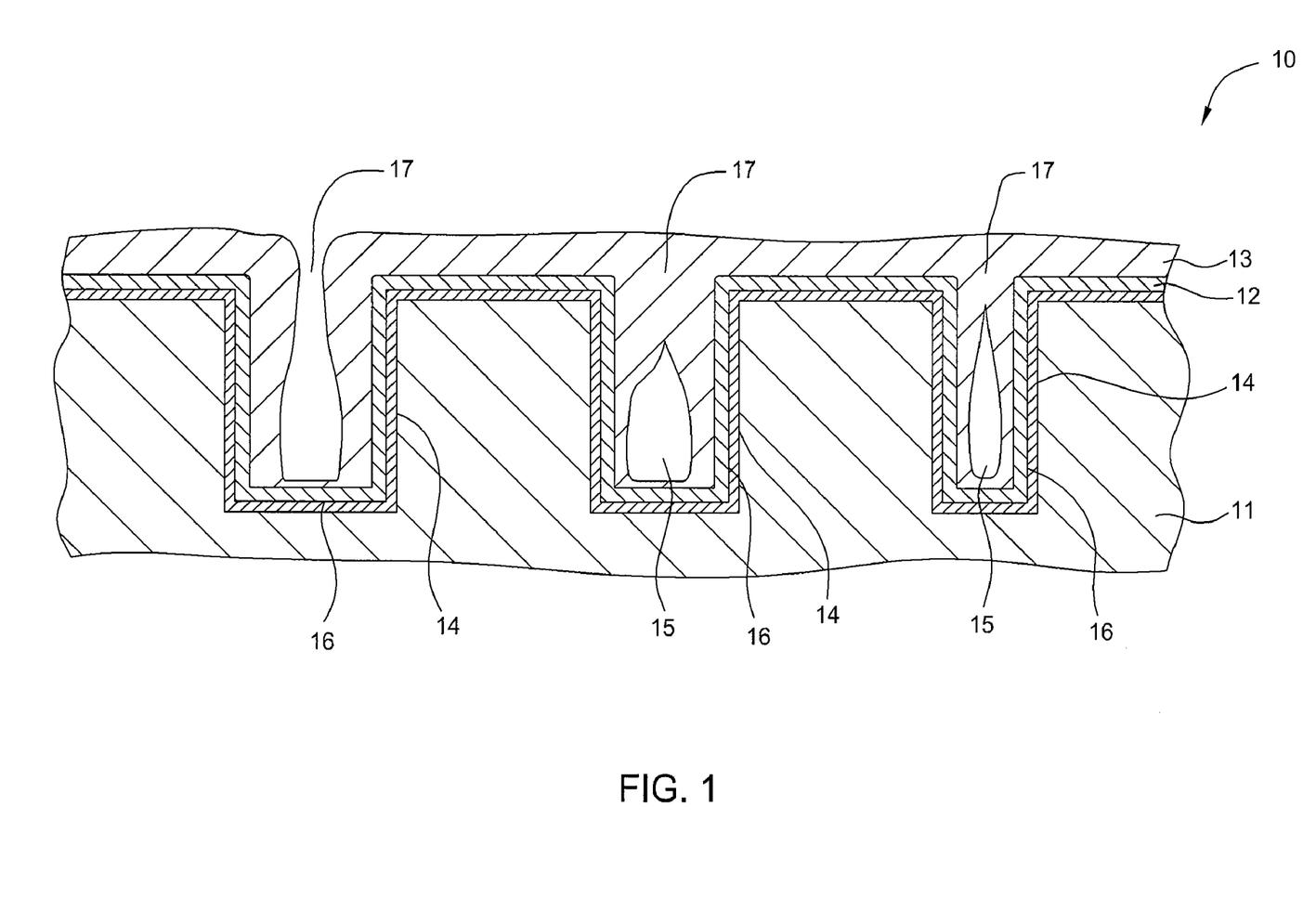
FIG. 1 schematically illustrates problems in plating trench and via structures.

FIG. 1 schematically illustrates problems in plating trench and via. Trench or via structures 14 are formed in a dielectric material 11 of a substrate 10. A barrier layer 16 is then deposited over the trench or via structures 14. A seed layer 12 is then deposited over the barrier layer 16. The seed layer 16 is thicker near entrances 17 of the trench or via structures 14 resulting in faster plating near the entrances 17. A metal layer 13 is then deposited to fill the trench or via structures 14. As shown in FIG. 1, voids 15 are formed in trench or via structures 14 with high aspect ratio during deposition of the metal layer 13.

Conventional fabrication process generally uses a sputtering process to reduce the thickness of the seed layer 12 near the entrances 17 prior to plating. Sputtering generally uses positive ions to physically knock out atoms in the seed layer. The positive ions, such as positive argon ions, are usually generated in a plasma chamber and then accelerated towards the target. The positive ions gain momentum during acceleration and strike top surfaces of the substrate. The ions physically knock out atoms in the seed layer. However, the ions strike the entire substrate. Additionally, the dislodged particles generated during sputtering require additional cleaning process and may still become potential source of contamination for subsequent processing.

Therefore, there is a need for methods and apparatus for improving plating conductive materials in trench or via structures.

SUMMARY OF THE INVENTION

Embodiments of the present invention generally relate to an apparatus and a method for processing semiconductor substrates. Particularly, embodiments of the present invention relate to methods and apparatus facilitating a bottom up trench or via structure filling.

One embodiment provides a method for processing a substrate comprising forming a seed layer over a substrate having trench or via structures formed therein, coating a portion of the seed layer with an organic passivation film, and immersing the trench or via structures in a plating solution to deposit a conductive material over the seed layer not covered by the organic passivation film.

Another embodiment provides a method for processing a substrate comprising depositing a seed layer over surfaces of trench or via structures formed in the substrate, applying a passivation film over the substrate to cover the seed layer near top openings of the trench or via structures, and plating a conductive material in the trench or via structures by immersing the trench or via structures in a plating solution, wherein the passivation film dissolves in the plating solution during plating.

Yet another embodiment provides a method processing a substrate comprising depositing a seed layer on a substrate having trench or via structures formed therein, spinning coating the substrate to form a passivation film over at least a portion of the seed layer, and immersing the trench or via structures in a plating solution to deposit a conductive material over the seed layer not covered by the passivation film and to dissolve the passivation film in the plating solution.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relate to apparatus and methods for processing semiconductor substrates. Particularly, embodiments of the present invention relate to methods and apparatus facilitating a bottom up trench or via structure filling. One embodiment of the present invention provides coating a portion of trench or via structures with a passivation film before depositing a filling material in the trench or via structures. In one embodiment, the passivation film is formed near top openings of the trench or via structures and is configured to retarding deposition of the filling material near the top openings in the subsequence deposition process.

In one embodiment, a plating process is used to depositing the filling material in the trench or via structures, and the passivation film is dissolvable in a plating solution. At the beginning of the plating process, the filling material is only deposited on bottom portions of the trench or via structures before the passivation film is dissolved in the plating solution resulting in a bottom up filling. Therefore, methods of the present invention enable bottom up filling without using invading ions to physically attack the trench or via structures, and the substrate.

In one embodiment, the passivation film comprises a surfactant. In one embodiment, the surfactant comprises planar molecules. In one embodiment, coating the passivation film comprises spinning coating a liquid solution of the surfactant on a substrate with trench or via structures formed therein. In another embodiment, coating the passivation film comprises dipping the trench or via structure in a liquid solution of the surfactant.

Figure 2A:
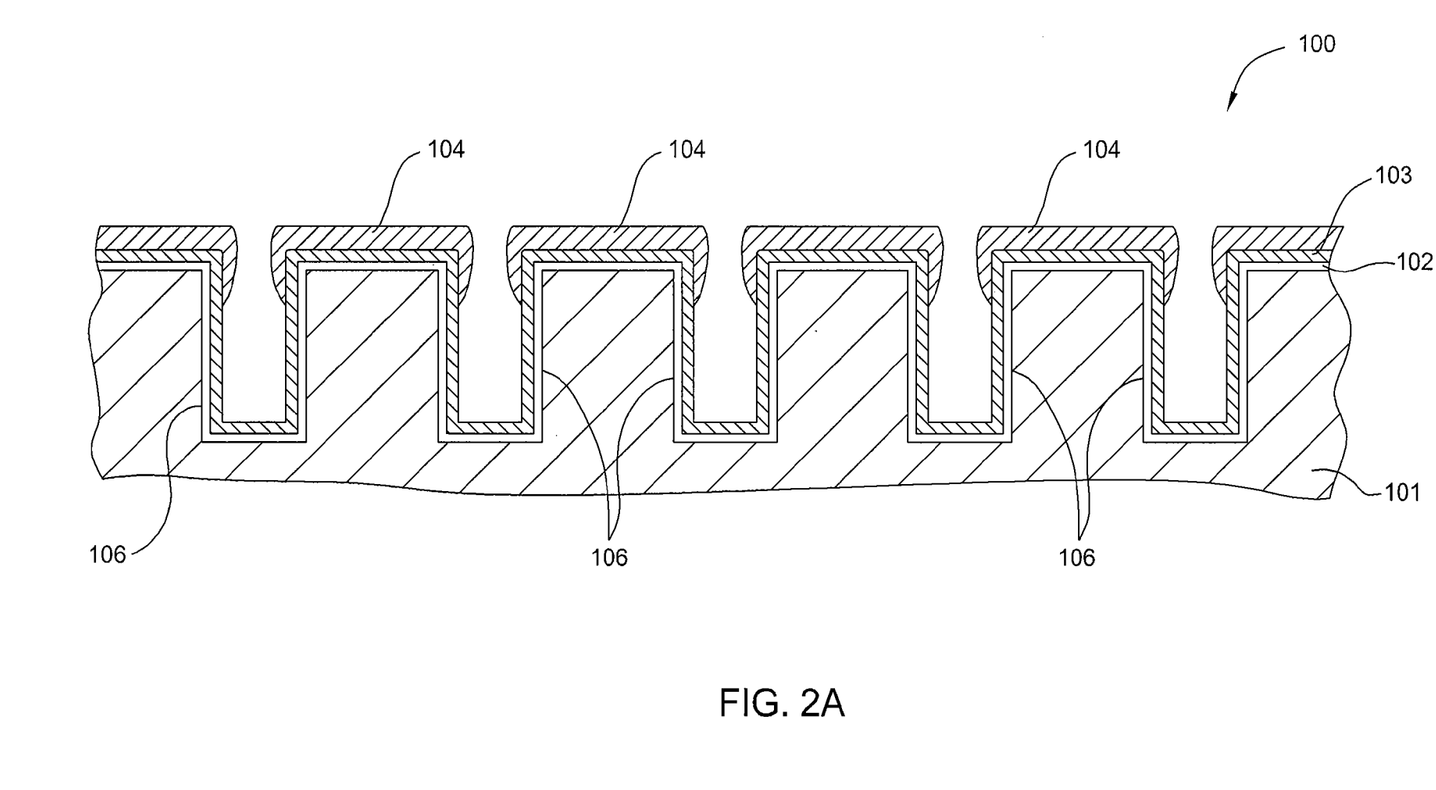
FIGS. 2A-2D schematically illustrate a method for filling trench or via structures in accordance with one embodiment of the present invention.

FIGS. 2A-2D schematically illustrate a sequence for filling trench or via structures in accordance with one embodiment of the present invention. FIG. 3 is a schematic flow chart of a process 200 for filling trench or via structures as shown in FIGS. 2A-2D.

Block 210 of the process 200 comprises forming trench or via structures in a substrate. The trench or via structures are generally used to form different portions of semiconductor devices. For example, the trench or via structures are commonly used to retain conductive materials therein and form interconnects in semiconductor devices. FIG. 2A is a schematic sectional side view of a substrate 100 having trench or via structures 106 formed in a dielectric material 101. In one embodiment, the trench or via structures 106 are configured to form conductive interconnects therein.

Block 220 of the process 200 comprises depositing a barrier layer over the trench or via structures. A barrier layer is commonly used to prevent copper in an interconnect from diffusing into neighboring areas. As shown in FIG. 2A, a barrier layer 102 is formed in the trench or via structures 106 to prevent conductive materials subsequently deposited in the trench or via structures 106 from diffusing into the dielectric material 101.

Block 230 of the process 200 comprises deposition a seed layer over the trench or via structures. As shown in FIG. 2A, a seed layer 103 is deposited over the barrier layer 102 throughout a top surface of the substrate 100. The seed layer 103 is configured to form a conductive surface for the subsequent plating process, such as electroplating. The seed layer 103 may be deposited using physical vapor deposition (PVD). The seed layer 103 is generally thicker over top openings than over sidewalls of the trench or via structures 106 because of the natural of the PVD process. As discussed above, unevenness of the seed layer 103 may cause void formation in the subsequent plating without treatment.

Block 240 of the process 200 comprises coating a portion of the seed layer with a passivation film. In one embodiment, the passivation film is coated over the seed layer on upper portions of the trench or via structures. The passivation film is configured to prevent metal deposition over the seed layer underneath. In one embodiment, the passivation film comprises a surface acting agent, also known as surfactant.

In one embodiment, the passivation film may have various thickness across the seed layer. For example, the passivation film is much thicker over the seed layer on the upper portions of the trench or via structures than over the seed layer on the lower portions of the trench or via structures. The passivation film is dissolvable in water. When the trench or via structures are immersed in a water based plating solution, lower portions of the passivation film being thin will be dissolved first and expose the seed layer underneath for deposition of the filling materials, therefore, enabling a bottom up filling.

In one embodiment, the surfactant is an organic compound having planar molecule, and is dissolvable in water. In one embodiment, the surfactant comprises 1-2-3-Benzotriazole (BTA), or similar compounds.

In one embodiment, the passivation film 104 may comprise an anti-corrosion agent for materials comprised in the seed layer 103. In one embodiment, the anti-corrosion agent comprise imidazole (IMA).

FIG. 2A shows a passivation film 104 formed over top portions of the trench or via structures 106. The seed layer 103 on lower portions of the trench or via structures 106 are not covered by the passivation film 104.

In one embodiment, coating the passivation film 104 comprises spinning coating a liquid solution of a surfactant. In another embodiment, coating the passivation film 104 comprises dipping the trench or via structure in a liquid solution of a surfactant. Detailed description of methods for applying the passivation film 104 will be discussed in association with FIGS. 4 and 5.

Block 250 of the process 200 comprises filling the trench or via structures with a conductive material. In one embodiment, filling the trench or via structures are performed by immersing the trench or via structures in a plating solution.

Figure 2B:
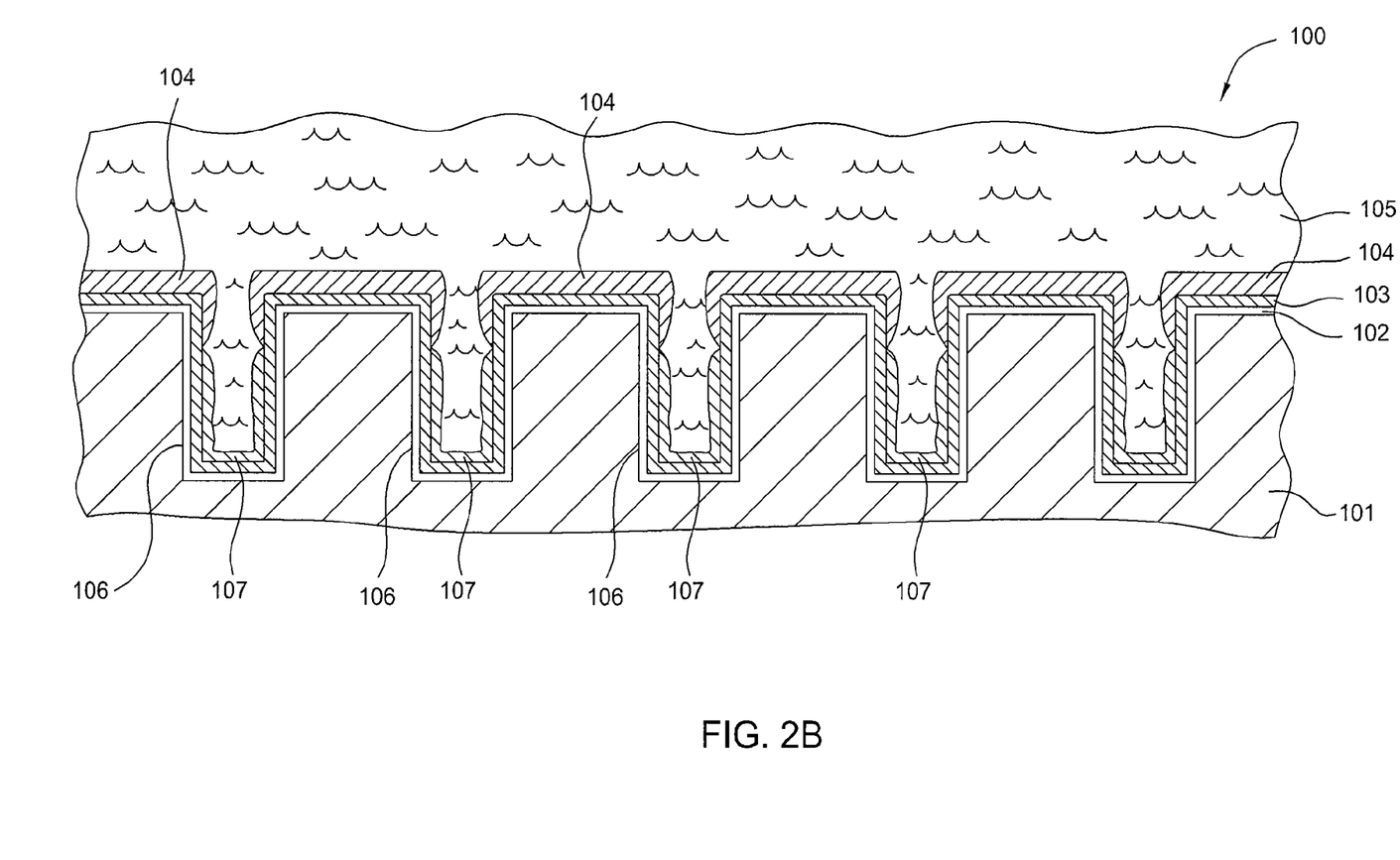
Figure 3:
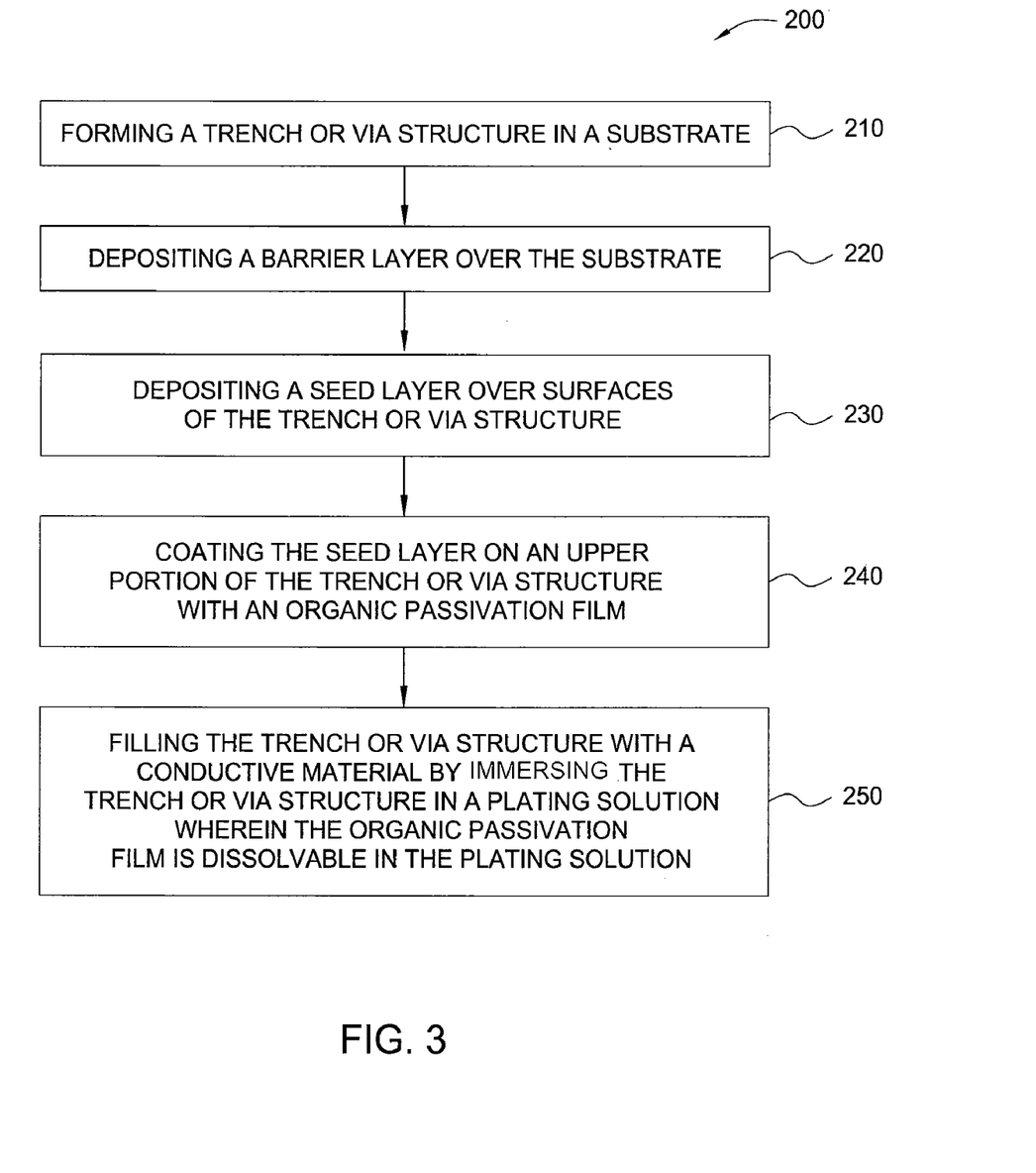
FIG. 3 is a schematic flow chart of a process for filling trench or via structures in accordance with one embodiment of the present invention.

FIG. 2B illustrates that the substrate 100 is immersed in a plating solution 105 and the plating solution 105 is in contact with surfaces of the trench or via structures 106. Even though, FIG. 2B shows that the substrate 100 is "socked" in the plating solution 105 with device side facing up, it is known to people skilled in the art that the substrate 100 may be positioned in any suitable position, such as facing down and dipping into a plating bath.

As shown in FIG. 2B, conductive material 107 grows from portions of the seed layer 103 that are not covered by the passivation film 104. In this case, lower portions of the seed layer 103 are exposed to the plating solution 105 directly, and the conductive material 107 fills the trench or via structures 106 in a bottom up manner.

Figure 2C:
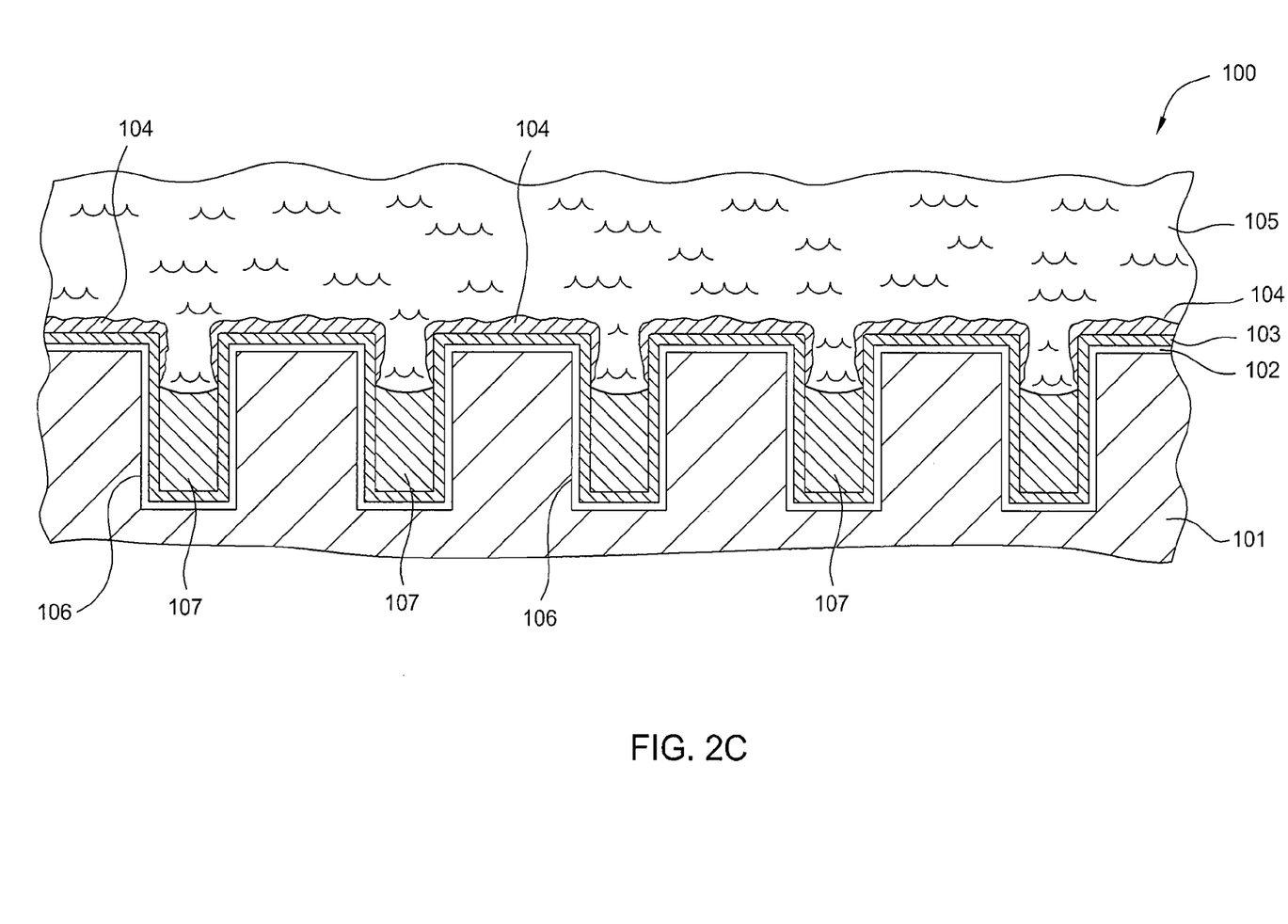
Figure 2D:
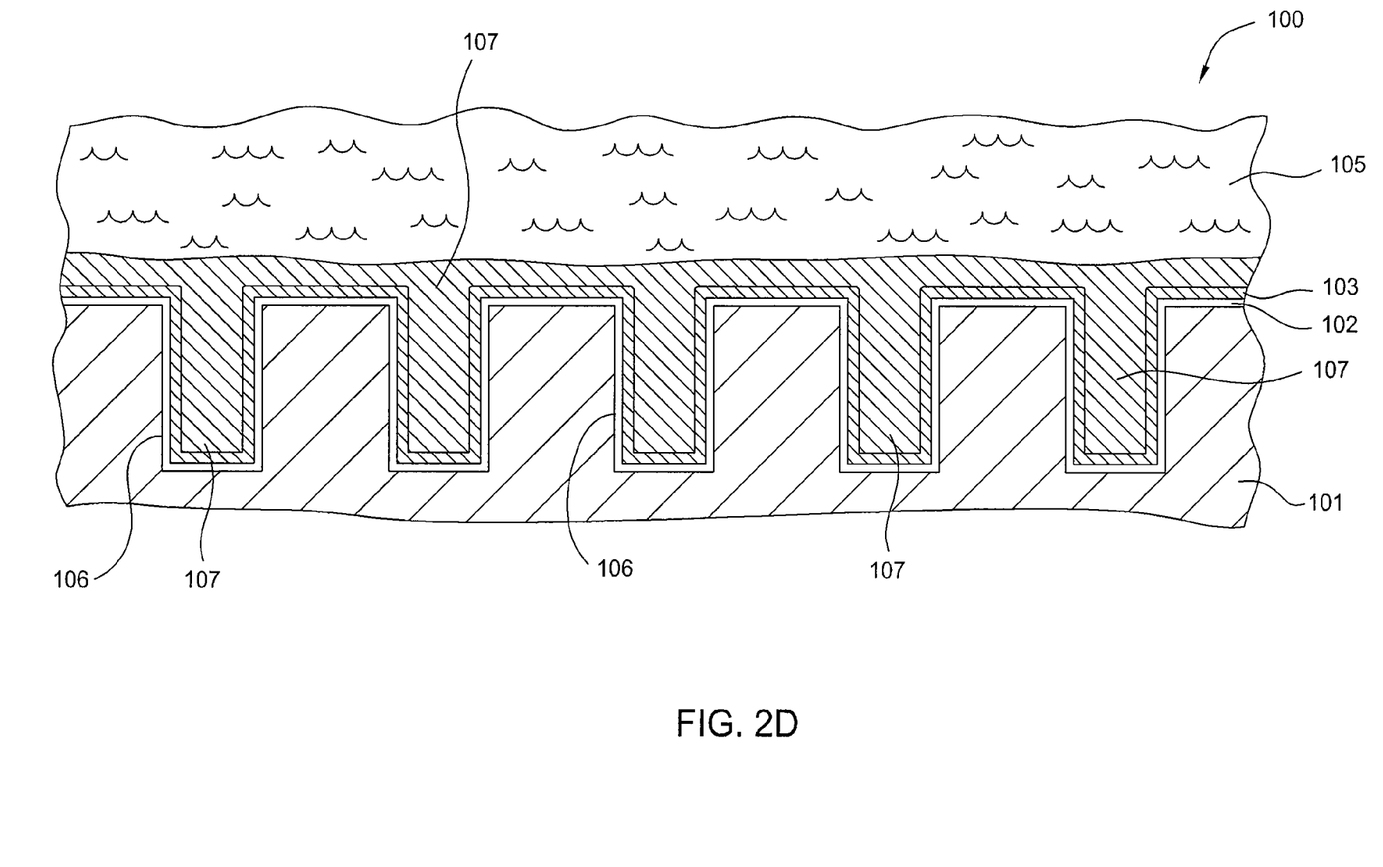

FIG. 2C schematically illustrates a sectional side view of the substrate 100 after being plated for a while. The conductive material 107 has filled bottom portions of the trench or via structures 106, while the top portions of the trench or via structures 106 remaining under the cover of the passivation film 104. The passivation film 104, however, is dissolving into the plating solution 105. The passivation film 104 would eventually dissolve completely in the plating solution 104, and allow deposition of the conductive material 107 over the top portions of the trench or via structures 106, as shown in FIG. 2D.

Figure 4A:
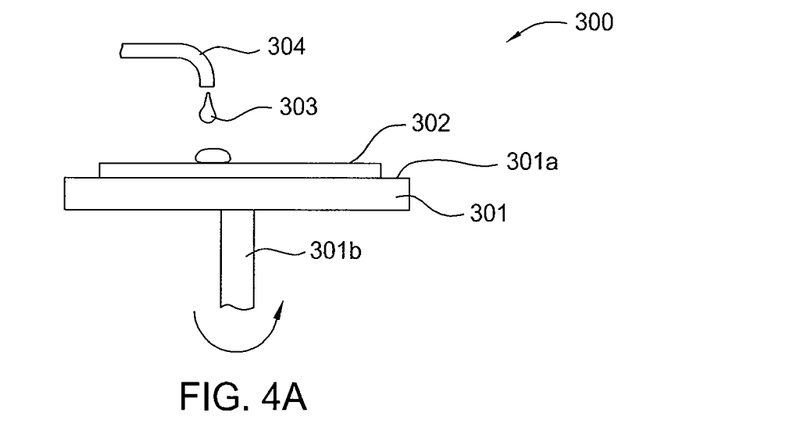
FIGS. 4A-4C schematically illustrate a method for applying a passivation film in accordance with one embodiment of the present invention.
Figure 4B:
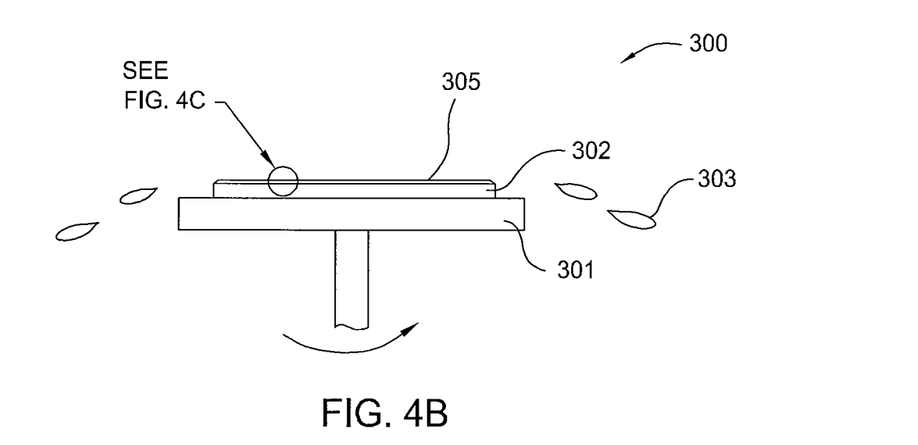
Figure 4C:
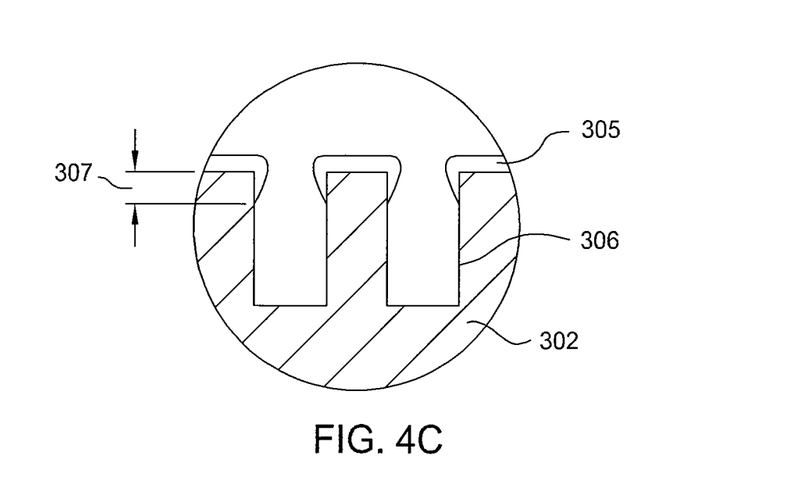

FIGS. 4A-4C schematically illustrate a method for applying a passivation film in accordance with one embodiment of the present invention. Particularly, the passivation film may be a layer of surfactant applied by spinning coating. Due to centrifugal force in the spinning coating process, the applied passivation film may have a diminishing thickness profile from top of the trench or via structure to the bottom of the trench or via structure. High rotation rate results in little or no coating at the bottom of the trench or via structure. By the same philosophy, the physical properties of solution also play an equivalent role in delivering protective surfactant into structure for intended depth.

Because surfactants dissolves in plating solution, or the electrolyte, the bottom surface of the trench or via structure exposes to the electrolyte first when the surfactant covers top surfaces of the trench or via structure before the surfactant dissolves. Therefore, a bottom-up plating can be achieve.

As shown in FIG. 4A, a passivation film, such as the passivation film 104 of FIG. 2A, can be applied using a spinning coating device 300. The spinning coating device 300 generally comprises a substrate support assembly 301 configured to support a substrate 302 on a top surface 301a and to rotate the substrate 302 about a spindle 301b. The spinning coating device 300 further comprises a liquid dispenser 304 comprises to dispense a liquid solution 303 towards the substrate 302 disposed on the substrate support assembly 301.

The liquid solution 303 is generally disposed to the substrate 302 while the substrate support assembly 301 rapidly rotates the substrate 302. The liquid solution 303 spreads across the substrate 302 then flies out the substrate 302 due to the centrifugal force, and leaving a thin layer 305 over the substrate 302, as shown in FIG. 4B.

FIG. 4C is an enlarged view of the thin layer 305 over the substrate 302. As shown in FIG. 4C, the substrate 302 has trench or via structures 306 formed therein. By adjusting rotation speed during spinning coating, property of the liquid solution 303, or combinations thereof, the thin layer 305 resulting from spinning coating may be controlled within upper portions of the trench or via structures 306.

In one embodiment, a depth 307 of the thin layer 305 in the trench or via structures 306 may be controlled by adjusting a rotation speed of the substrate 302. In one embodiment, the depth 307 may be reduced by increasing the rotation speed of the substrate 302, and the depth 307 may be increased by reducing the rotation speed of the substrate 302.

The liquid solution 303 generally comprises a carrier and a solute, such as such as a surfactant or an anti corrosion agent. In one embodiment, the carrier may comprise isopropyl alcohol (IPA).

In another embodiment, the depth 307 of the thin layer 305 in the trench or via structures 306 may be controlled by adjusting properties of a carrier of the liquid solution 303. In one embodiment, the depth 307 may be increased by selecting a more hydrophilic or volatile carrier. In one embodiment, the depth 307 may be adjusted by adjusting viscosity of the carrier.

In another embodiment, the depth 307 of the thin layer 305 in the trench or via structures 306 may be controlled by adjusting properties of a solute of the liquid solution 303. The properties of the solute usually changes the properties of the liquid solution.

In one embodiment, the carrier vaporizes after spinning coating, leaving the solute remaining on the substrate 302 in the thin layer 305. In one embodiment, the thin layer 305 may comprise several molecule layers of the solute, such as a surfactant or an anti corrosion agent. In another embodiment, the substrate 302 may be baked after spinning coating to vaporize the carrier from the thin layer 305.

Figure 5:
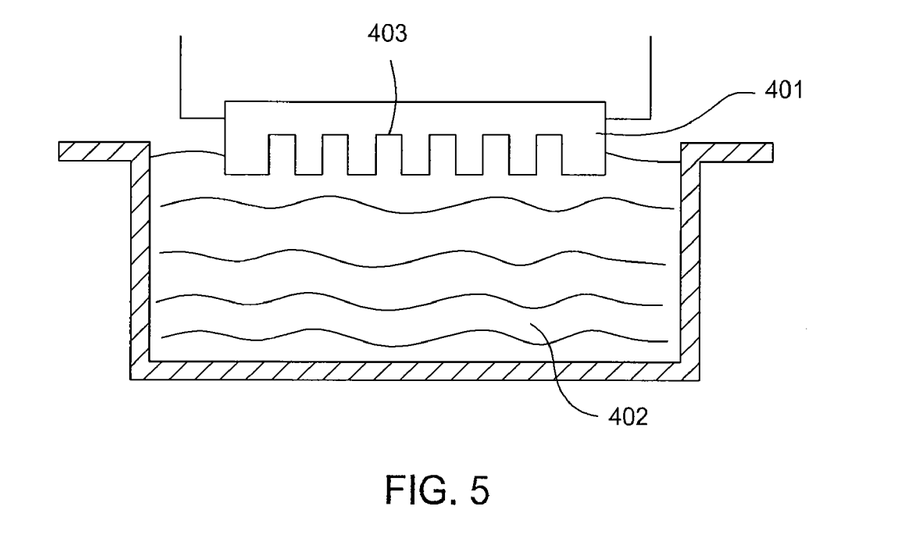
FIG. 5 schematically illustrates a method for applying a passivation film in accordance with another embodiment of the present invention.

FIG. 5 schematically illustrates applying a passivation film by dipping a substrate in a liquid solution. A substrate 401 having trench or via structures 403 formed therein may be faced down and dipped into a liquid solution 402 to form a passivation film, such as the passivation film 104 of FIG. 2A. The liquid solution 402 generally has a hydrophobic carrier to obtain a thin film over upper portions (portions near entrances of the trench or via structures) of the trench or via structures.

Figure 6A:
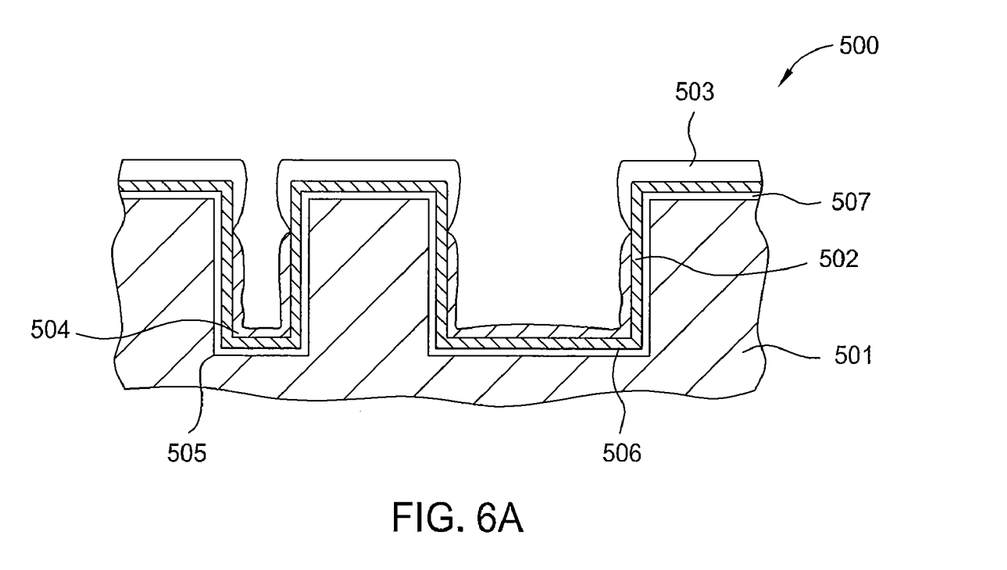
FIGS. 6A-6D schematically illustrate a method for filling trench or via structures in accordance with one embodiment of the present invention.

FIGS. 6A-6D schematically illustrate a method for filling trench or via structures with various dimension in accordance with one embodiment of the present invention. FIG. 7 is a schematic flow chart of a process 600 for filling trench or via structures in accordance with the method showing in FIGS. 6A-6D.

Block 610 of the process 600 comprises depositing a seed layer over a substrate having trench or via structures of different dimension. As shown in FIG. 6A, a large trench or via structure 506 and a small trench or via structure 505 are formed in a dielectric material 501 of a substrate 500. A barrier layer 507 is deposited over surfaces of the trench or via structures 505, 506. A seed layer 502 is deposited over the barrier layer 507. The seed layer 502 may be deposited using physical vapor deposition (PVD). The seed layer 502 is generally thicker over top openings than over sidewalls of the trench or via structures 505, 506 because of the natural of the PVD process.

Block 620 of the process 600 comprises coating a portion of the seed layer with a passivation film. The passivation film may be coated over the seed layer on upper portions of the trench or via structures. The passivation film is configured to prevent metal deposition over the seed layer underneath. In one embodiment, the passivation film comprises a surfactant. The passivation film may be formed by spinning coating or by dipping the substrate in a liquid solution, as discussed above with FIGS. 4 and 5. As shown in FIG. 6A, a passivation film 503 is formed over upper portions of the trench or via structures 505, 506.

Block 630 of the process 600 comprises filling the trench or via structures with a conductive material. In one embodiment, filling the trench or via structures are performed by immersing the trench or via structures in a plating solution. Similar to the plating process described in the process 200, the passivation film enables a bottom up filling effect in trench or via structures by retarding plating on upper portions of the trench or via structures.

Figure 6B:
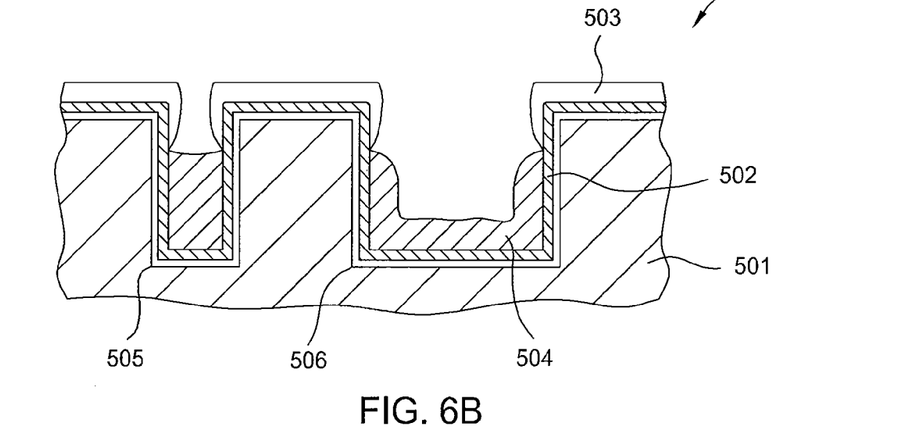
Figure 7:
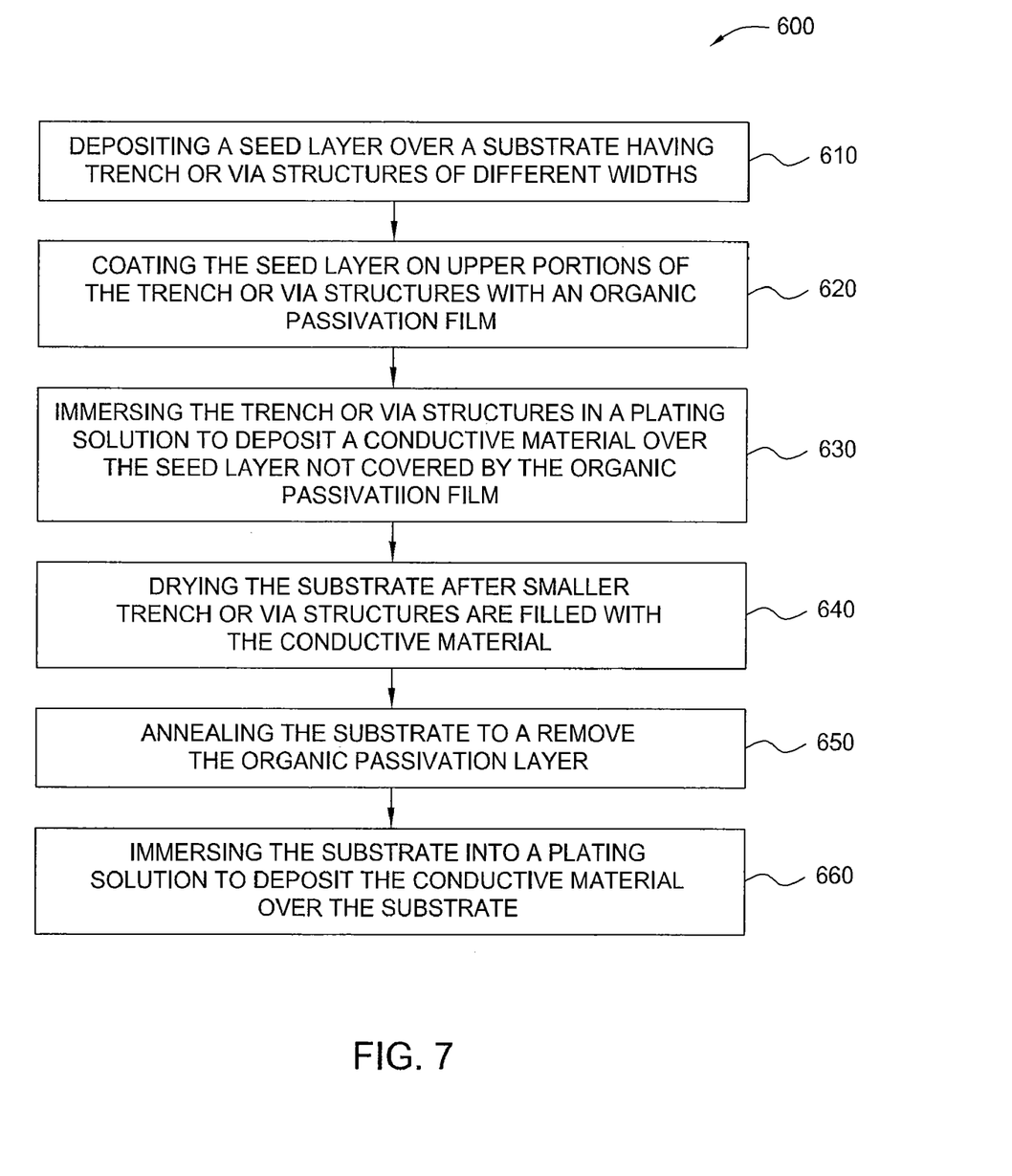
FIG. 7 is a schematic flow chart of a process for filling trench or via structures in accordance with one embodiment of the present invention.

FIG. 6B illustrates a plating result after the substrate 500 has been immersed in a plating solution for a while. The small trench or via structure 505, having a high aspect ratio, is mostly filled up by a conductive material 504, while the large trench or via structure 506 still have a majority of inner volume unfilled. The passivation film 503 may still remain over the seed layer 502.

At this point, the substrate 500 can remain in the plating solution till the large trench or via structure 506 is also filled if the passivation film 503 is dissolvable in the plating solution. A plating rate is generally set at a low value when filling high aspect ratio trench or via structures to reduce void formation. After the small trench or via structure 505 is filled, it is not necessarily to remain the low plating rate. Therefore, it is desirable to change the plating parameters for an increase plating rate in filling the large trench or via structure 506.

Block 640 of the process 600 comprises drying the substrate after narrow trench or via structures are filled with a conductive material.

Figure 6C:
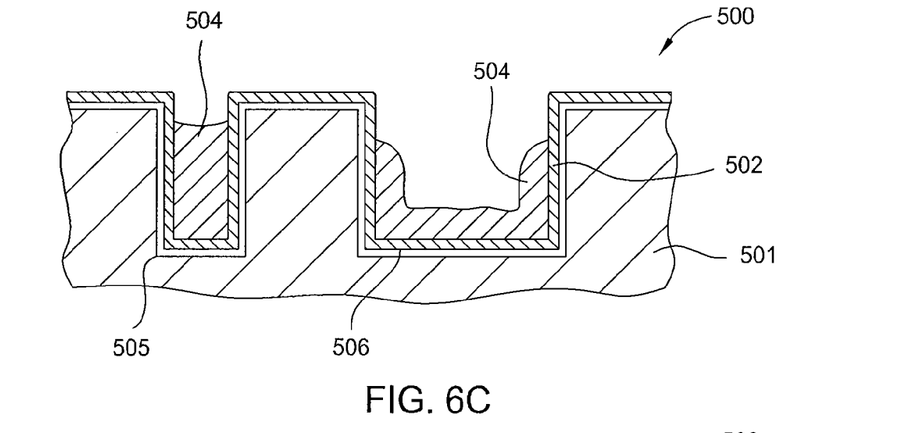
Figure 6D:
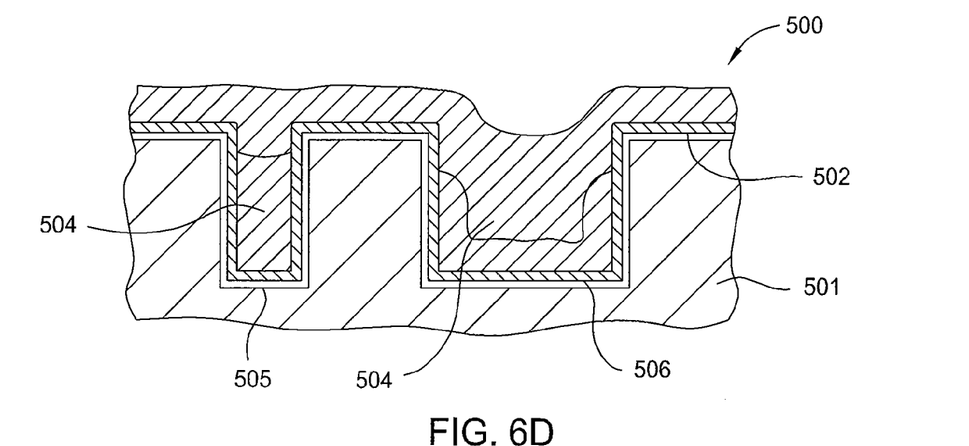

Block 650 of the process 600 comprises annealing the substrate to remove remaining passivation film. Blocks 640 and 650 allow the previously covered seed layer to be uncovered from the passivation film. FIG. 6C illustrates the substrate 500 after the passivation film has been removed.

Block 660 of the process 600 comprises immersing the substrate in a plating solution to deposit the conductive material over the substrate. In one embodiment, the plating process in block 660 have a faster plating rate that the plating process in block 630. In one embodiment, the same plating solution may be mused in blocks 630 and 660. In another embodiment, different plating solutions may be used in blocks 630 and 660. As shown in FIG. 6C, both the small trench or via structure 505 and the large trench or via structure 506 are filled with the conductive material 504.

The process 600 is particularly useful when trench or via structures on a substrate vary by a great degree. Plating rates in blocks 630 and 660 may be set differently to prevent void formation in trenches with high aspect ratio and to speed up filling of trenches with large dimension.

The process 600 is also useful when the passivation film is not dissolvable in the plating solution.

Figure 8:
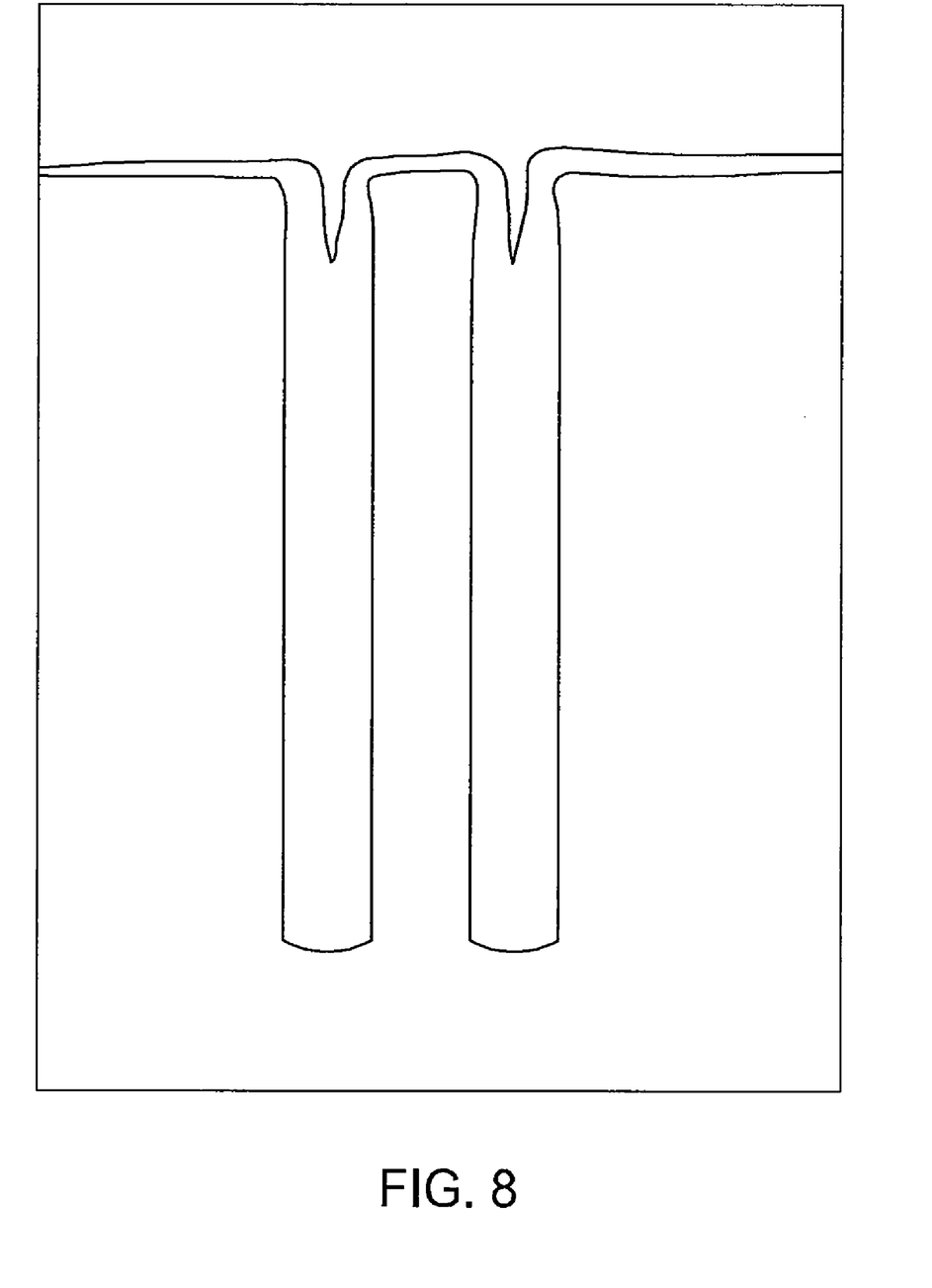
FIG. 8 is an optical electron microscope image of via filling result in accordance with one embodiment of the present invention.

FIG. 8 is an optical microscope image of via filling result in accordance with one embodiment of the present invention. The vias in FIG. 8 are formed in a silicon substrate and have a depth of about 140 microns and a diameter of about 14 microns. A copper seed layer having a thickness of about 6000 angstroms is deposited prior to passivation coating. In passivation coating, a liquid solution of 1-2-3-Benzotriazole (BTA) dissolved in isopropyl alcohol (IPA) is spinning coated over the substrate. The coated substrate is then immersed in a plating solution configured to plate copper on the substrate. FIG. 8 is an image after the plating. The copper body is shown in white. As shown in FIG. 8, the vias are filled with copper in a bottom up manner.

Figure 9:
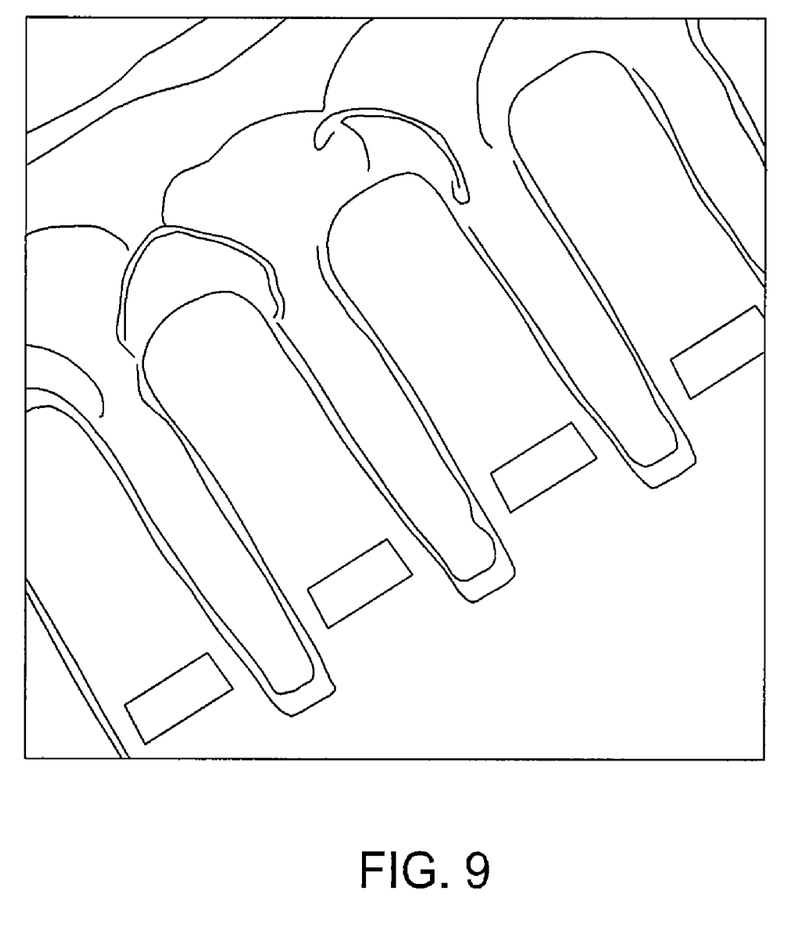
FIG. 9 is a transmission electron microscopy (TEM) image of a trench filling result in accordance with one embodiment of the present invention.

FIG. 9 is a transmission electron microscopy image of filling results of trench structures using a method in accordance with one embodiment of the present invention. The trench structures have a critical dimension of 25 nm near the bottoms. The trenches are filled by copper in an electroplating process after a passivation coating is applied in accordance with embodiments of the present invention. The trenches are filled from bottom up. It can be observed that the electroplated copper "spill" out of the trenches like mushrooms, while the original copper seed layer remains intact.

Even though trench or via structure filling is described in the present application, embodiments of the present invention are applicable in filling other structures, such as trench and via combinations, or any other openings.

While the foregoing is directed to embodiments of the present invention, other and further embodiments of the invention may be devised without departing from the basic scope thereof, and the scope thereof is determined by the claims that follow.

What is claimed is:

1. A method for processing a substrate, comprising:
    forming a seed layer over a substrate having trench or via structures formed therein;
    coating a portion of the seed layer with an organic passivation film, wherein coating a portion of the seed layer comprises coating the seed layer over an upper portion of the trench or via structures by dipping the substrate in a liquid solution containing an organic surfactant, and the liquid solution comprises a hydrophobic carrier and the organic surfactant suspended in the hydrophobic carrier; and
    immersing the trench or via structures in a plating solution to deposit a conductive material over the seed layer not covered by the organic passivation film, wherein the organic passivation film is dissolvable in the plating solution.

2. The, method of claim 1 wherein the organic surfactant comprises 1-2-3-Benzotriazole (BTA).

3. The method of claim 2, wherein the liquid solution comprises isopropyl alcohol (IPA).

4. The method of claim 1, further comprising:
    removing the substrate from the plating solution;
    removing the passivation film to expose portions of the seed layer that are previously covered by the passivation film; and
    immersing the substrate in the plating solution to plate the conductive material over the substrate.

5. The method of claim 4, wherein removing the passivation film comprising annealing the substrate.

6. A method for processing a substrate, comprising:
    depositing a seed layer over surfaces of trench or via structures formed in the substrate;
    applying a passivation film over the substrate to cover the seed layer near top openings of the trench or via structures; and
    plating a conductive material in the trench or via structures by immersing the trench or via structures in a plating solution, wherein the passivation film dissolves in the plating solution during plating.

7. The method of claim 6, wherein the passivation film comprises a surfactant having planar molecules.

8. The method of claim 7, wherein applying the passivation film comprises spinning coating a liquid solution of the surfactant over the substrate.

9. The method claim 8, wherein the liquid solution comprises the organic surfactant comprises 1-2-3-Benzotriazole (BTA) and isopropyl alcohol (IPA).

10. The method of claim 7, wherein applying the passivation film comprises dipping the substrate into a liquid solution of the surfactant, and the liquid solution comprises a hydrophobic carrier.

11. A method for processing a substrate, comprising:
    depositing a seed layer on a substrate having trench or via structures formed therein;
    spinning coating the substrate to form a passivation film over at least a portion of the seed layer; and
    immersing the trench or via structures in a plating solution to deposit a conductive material over the seed layer not covered by the passivation film and to dissolve the passivation film in the plating solution.

12. The method of claim 11, wherein spinning coating the substrate comprises controlling depth that the passivation film reaches along sidewalls of the trench or via structures.

13. The method of claim 12, wherein controlling the depth comprises:
   increasing a rate of spinning to reduce the depth; and
   decreasing the rate of spinning to increase the depth.

14. The method of claim 13, wherein controlling the depth further comprising using a carrier of different viscosity during spinning coating to reduce the depth.

15. A method for processing a substrate, comprising:
   forming a seed layer over a substrate having trench or via structures formed therein;
   coating a portion of the seed layer with an organic passivation film, wherein coating a portion of the seed layer comprises:
      coating the seed layer over an upper portion of the trench or via structures by spinning coating a liquid solution containing an organic surfactant over the substrate, wherein the organic surfactant comprises 1-2-3-Benzotriazole (BTA); and
   immersing the trench or via structures in a plating solution to deposit a conductive material over the seed layer not covered by the organic passivation film, wherein the organic passivation film is dissolvable in the plating solution.

16. The method of claim 15, wherein the liquid solution comprises isopropyl alcohol (IPA).

17. The method of claim 15, wherein the coating a portion of the seed layer further comprises determining a rate of rotation for spinning coating according to a target depth of organic passivation film into the trench or via structures.

* * * * *